(12) United States Patent
Guebels

(10) Patent No.: US 7,187,208 B2
(45) Date of Patent: Mar. 6, 2007

(54) COMPLIMENTARY METAL OXIDE SILICON LOW VOLTAGE POSITIVE EMITTER COUPLED LOGIC BUFFER

(75) Inventor: Pierre Paul Guebels, Pleasanton, CA (US)

(73) Assignee: Phaselink Semiconductor Corporation, Labuan Ft (MY)

( * ) Notice: Subject to any disclaimer, the term of this patent is extended or adjusted under 35 U.S.C. 154(b) by 114 days.

(21) Appl. No.: 11/037,346

(22) Filed: Jan. 19, 2005

(65) Prior Publication Data

US 2006/0158227 A1    Jul. 20, 2006

(51) Int. Cl.
    *H03K 19/0175*    (2006.01)
(52) U.S. Cl. .......................... 326/86; 326/90; 326/126; 326/127
(58) Field of Classification Search ................. 326/86, 326/90, 115, 126, 127; 327/50–52, 63, 65, 327/562–5, 53; 330/231, 277, 253, 296
    See application file for complete search history.

(56) References Cited

U.S. PATENT DOCUMENTS 6,909,310 B2*  6/2005  Poulton et al. ............. 327/108
7,039,118 B1*  5/2006  Segaram ..................... 375/257

* cited by examiner

*Primary Examiner*—Anh Q. Tran
(74) *Attorney, Agent, or Firm*—Rosenberg, Klein & Lee

(57) ABSTRACT

A low voltage positive emitter coupled logic (LV-PECL) buffer fabricated in the complimentary oxide metal silicon (CMOS) process. The LV-PECL buffer in CMOS is operable for a wide frequency range from DC to frequencies as high as 800 MHZ in 0.5 um process. Synchronized feedforward logic is utilized without the need for a feedback loop. N-MOSFET's, which are faster than P-MOSFET's, are used for the implementation of switched current sources. The switched current sources deliver a pull-up current variable in time and as a result have more than two values. The pull-up current is sharply increased in value during the output waveform transition times in an impulse manner.

18 Claims, 12 Drawing Sheets

COMPLIMENTARY METAL OXIDE SILICON LOW VOLTAGE POSITIVE EMITTER COUPLED LOGIC BUFFER

BACKGROUND OF THE INVENTION

1. Field of the Invention

The present invention relates to a buffer. More specifically, the present invention discloses a low voltage positive emitter coupled logic buffer in complimentary metal oxide silicon process.

2. Description of the Prior Art

Low-Voltage Positive Emitter Coupled Logic (LV-PECL) buffers are notorious for their difficult implementation in a complimentary metal oxide silicon (CMOS) process. Conventional PECL logic exactly matches the physical characteristics of Bipolar devices. However, the physical characteristics of MOSFET devices do not fit such PECL logic definition at all. Therefore, implementation of PECL logic in a CMOS process has traditionally been unsuccessful or at best unsatisfactory.

Additionally, with the evolution to lower voltage power supplies and lower voltage power requirements, design of such implementations has been further complicated.

Refer to FIG. 1A, which is a schematic illustrating a P-MOS amplifier with P-MOS switch of the prior art.

As shown in FIG. 1A, The—PMOS amplifier is embedded in a wide-band loop. In this configuration, the maximum switching frequency is limited to below 160 MHz in a 0.35 um process. This switching frequency is unacceptable for most applications.

Refer to FIG. 1B, which is a drawing illustrating the pull-up current of the circuit illustrated in FIG. 1A. In the circuit, the P-MOS switched current source delivers a pull-up current varying between two values. These two values are IupH and IupL.

A disadvantage of the conventional circuit is that the starting rise and fall times are both frequency and process dependent. Different buffers are needed to cover a plurality of output frequencies. Additionally, the maximum speed is limited to the switching capability of the P-MOSFET.

Therefore, there is need for a low voltage positive emitter coupled logic buffer that is realized in a CMOS process which provides high frequency switching capabilities.

SUMMARY OF THE INVENTION

To achieve these and other advantages and in order to overcome the disadvantages of the conventional method in accordance with the purpose of the invention as embodied and broadly described herein, the present invention provides a CMOS low voltage positive emitter coupled logic buffer.

The LV-PECL buffer of the present invention is fabricated in a CMOS process. The implementation of the LV-PECL buffer in CMOS is useable for a wide frequency range from DC to frequencies of 800 MHz in a 0.35 um process or even higher.

The present invention utilizes synchronized feedforward logic without a feedback loop. Additionally, N-MOS switches are implemented as switched current sources since N-MOSFET's are faster devices than P-MOSFET's.

The control in time, or pulsed control, of the N-MOS switched current source enforces square voltage waveforms into the standard 50 Ohm LV-PECL loads. In other words, the switched current source delivers a pull-up current variable in time and having more than two values. The pull-up current is sharply increased in value only during the output waveforms transition times in an impulsive manner.

The present invention provides a LV-PECL buffer than enjoys the benefits and advantages of the CMOS process and also provides high frequency switching capabilities.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
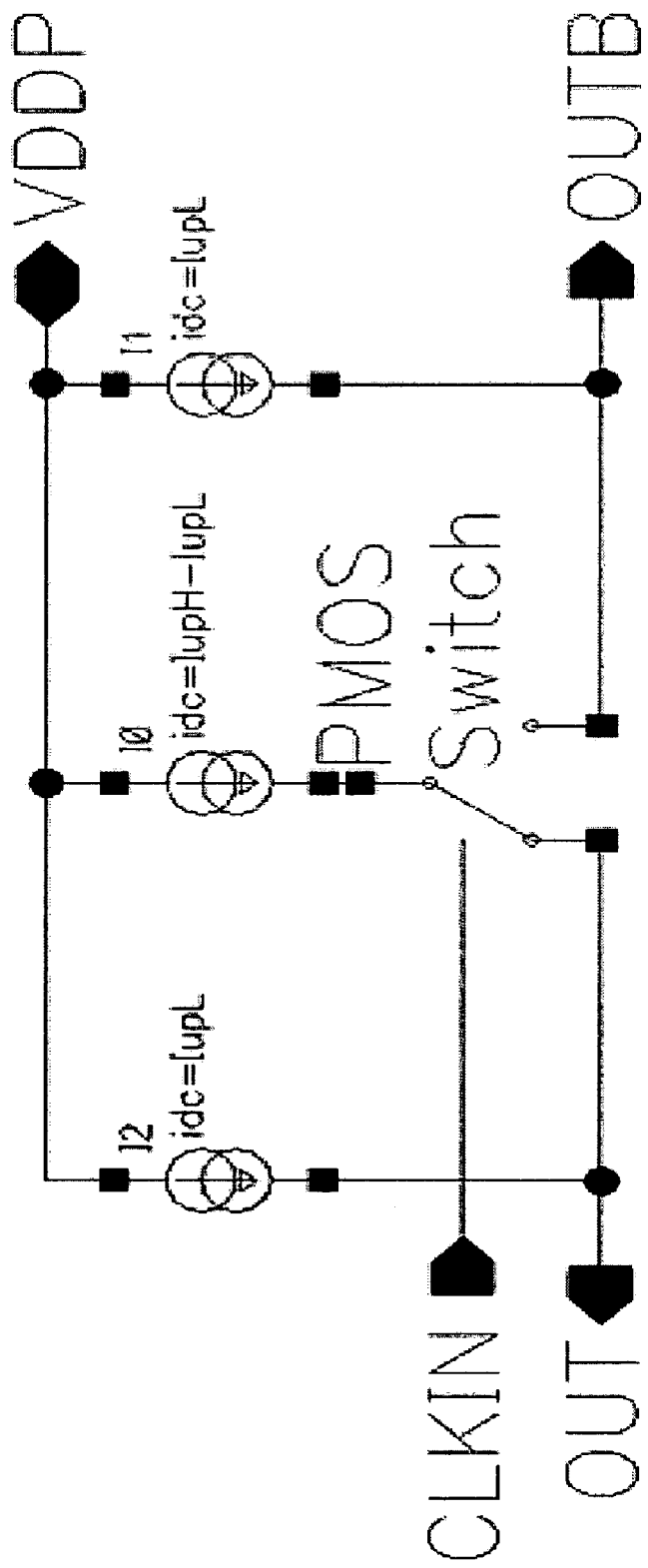
FIG. 1A is a schematic illustrating a P-MOS amplifier with P-MOS switch of the prior art.
Figure 1B:
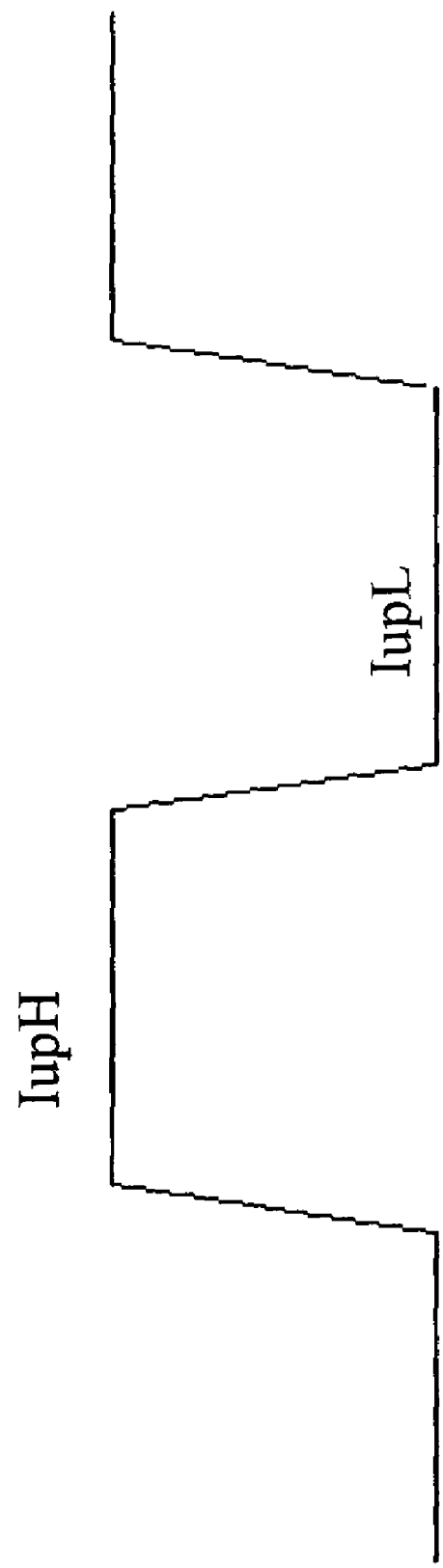
FIG. 1B is a drawing illustrating the pull-up current of the circuit illustrated in FIG. 1A.

Reference will now be made in detail to the preferred embodiments of the present invention, examples of which are illustrated in the accompanying drawings. Wherever possible, the same reference numbers are used in the drawings and the description to refer to the same or like parts.

Figure 2A:
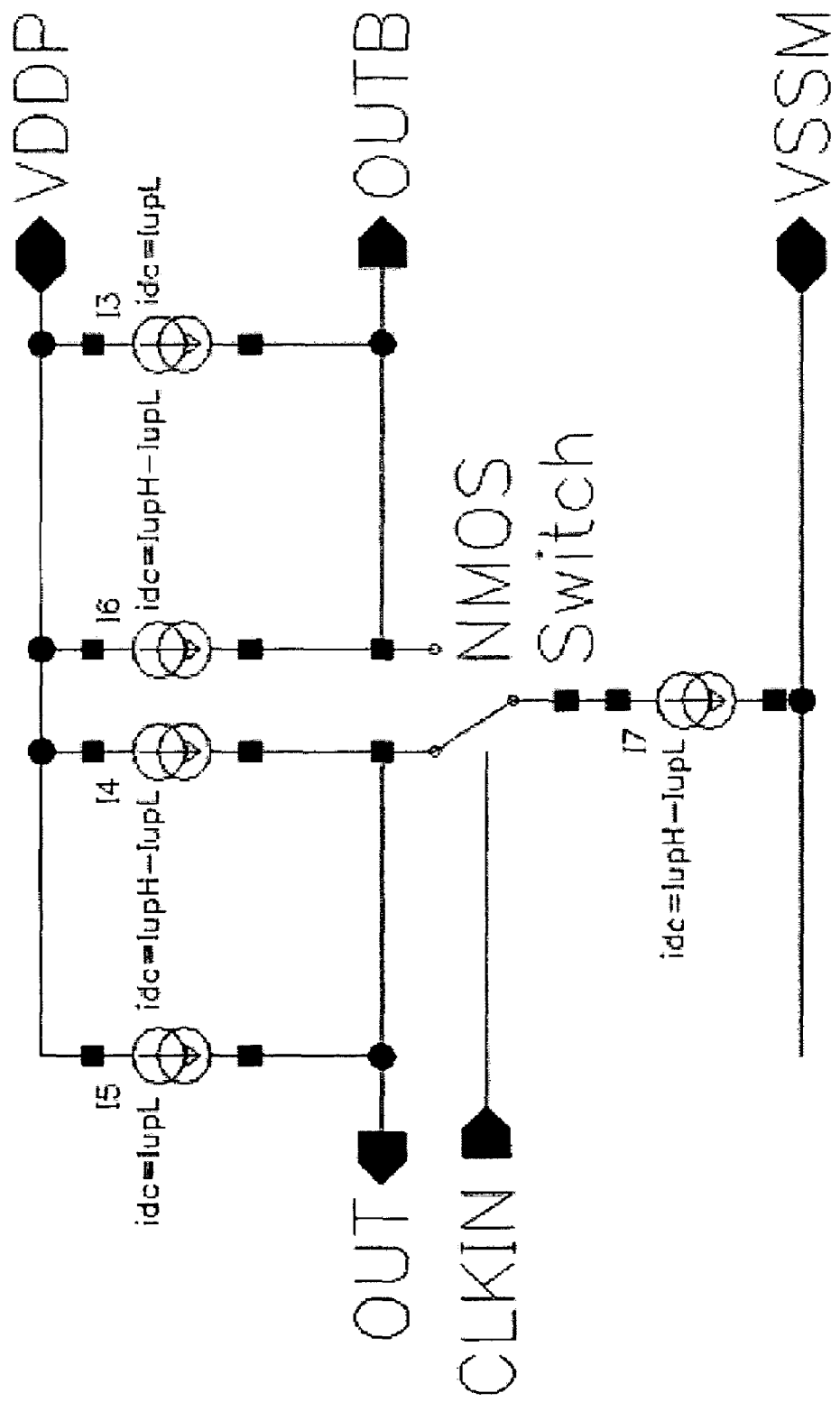
FIG. 2A is a schematic illustrating an amplifier utilizing an N-MOS switch according to an embodiment of the present invention.

Refer to FIG. 2A, which is an amplifier utilizing an N-MOS switch according to an embodiment of the present invention.

As shown in FIG. 2A, the amplifier comprises a clock input CLKIN, a first output OUT, a second output OUTB, a first voltage VDDP, a second voltage VSSM, an NMOS switch, and five current sources I3, I4, I5, I6, I7.

Current sources I5 and I4 are connected between VDDP and OUT. Current sources I3 and I6 are connected between VDDP and OUTB. OUTB is connected to one node of the NMOS Switch and OUT is connected to the other node of the NMOS Switch. Current source I7 is connected between the non-switching node of the NMOS Switch and VSSM. The clock input CLKIN controls the switching frequency of the NMOS Switch.

Figure 2B:
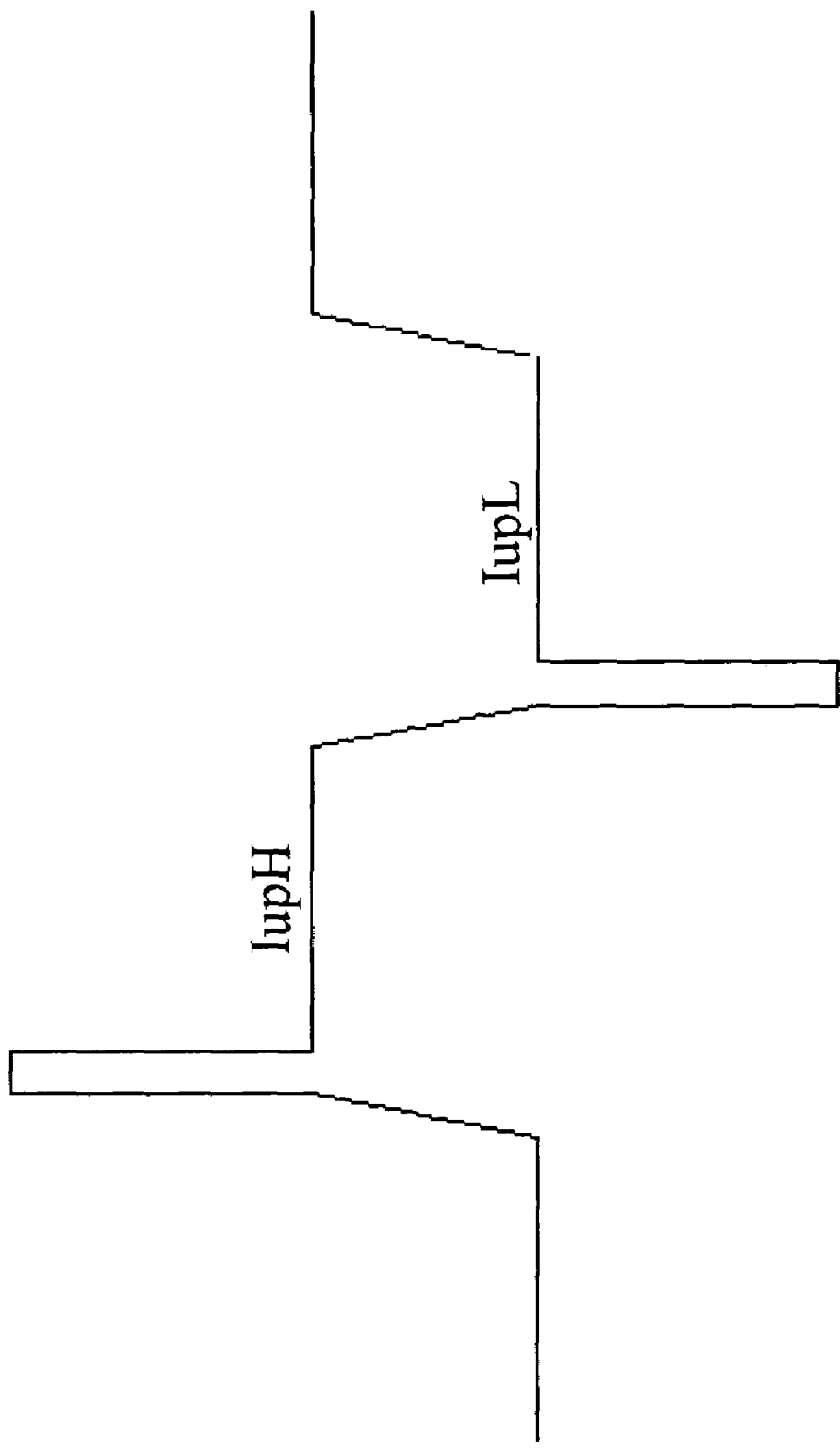
FIG. 2B is a drawing illustrating the pull-up current of the circuit illustrated in FIG. 2A according to an embodiment of the present invention.

Refer to FIG. 2B, which is a drawing illustrating the pull-up current of the circuit illustrated in FIG. 2A according to an embodiment of the present invention.

As shown in FIG. 2B, the control in time, or pulsed control, of the N-MOS switched current source enforces square voltage waveforms into the standard 50 Ohm LV-PECL loads. In other words, the switched current source delivers a pull-up current variable in time and having more than two values. The pull-up current is sharply increased in value only during the output waveforms transition times in an impulsive manner.

Figure 3A:
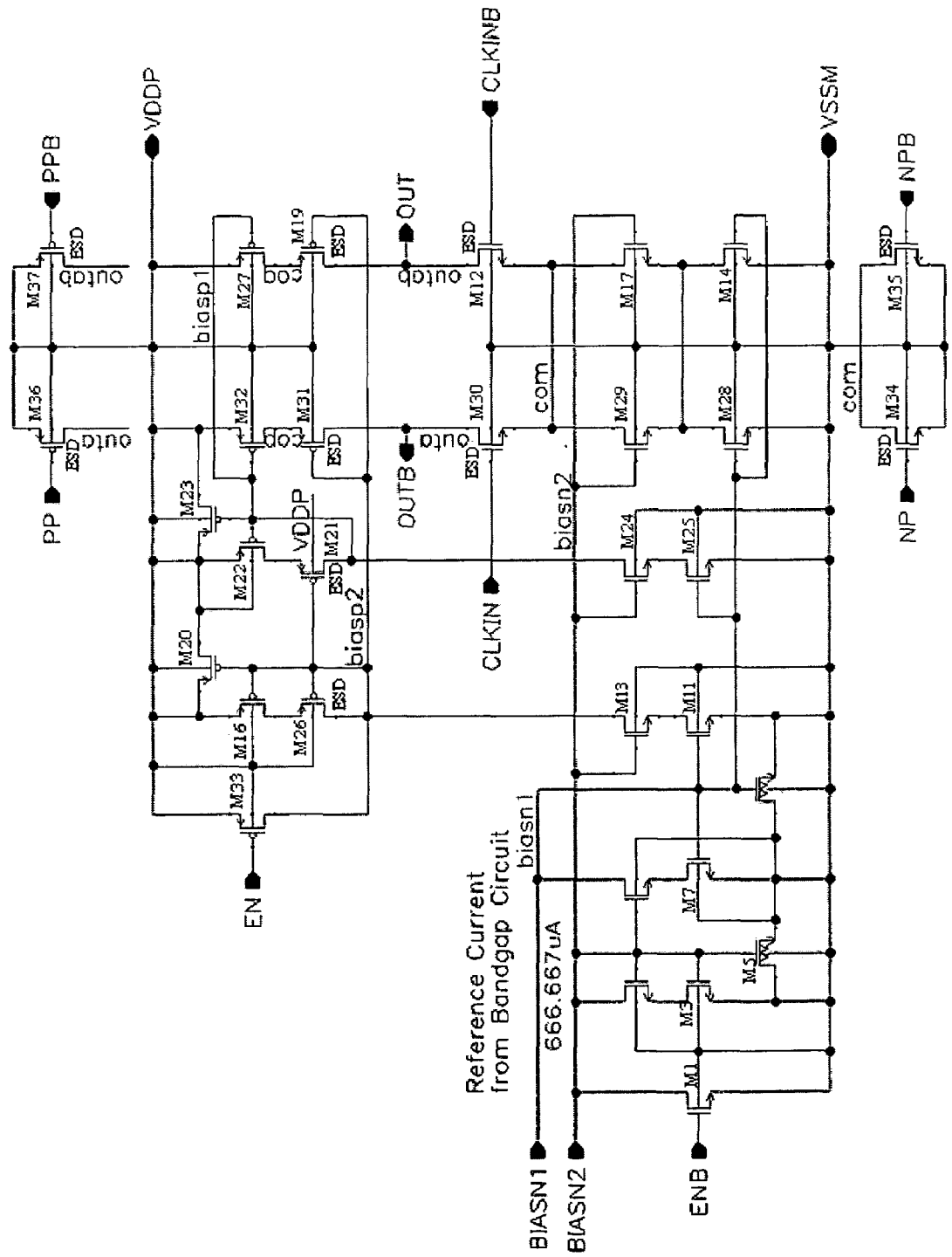
FIG. 3A is a circuit schematic illustrating a drive section of an LV-PECL buffer according to an embodiment of the present invention.
Figure 3B:
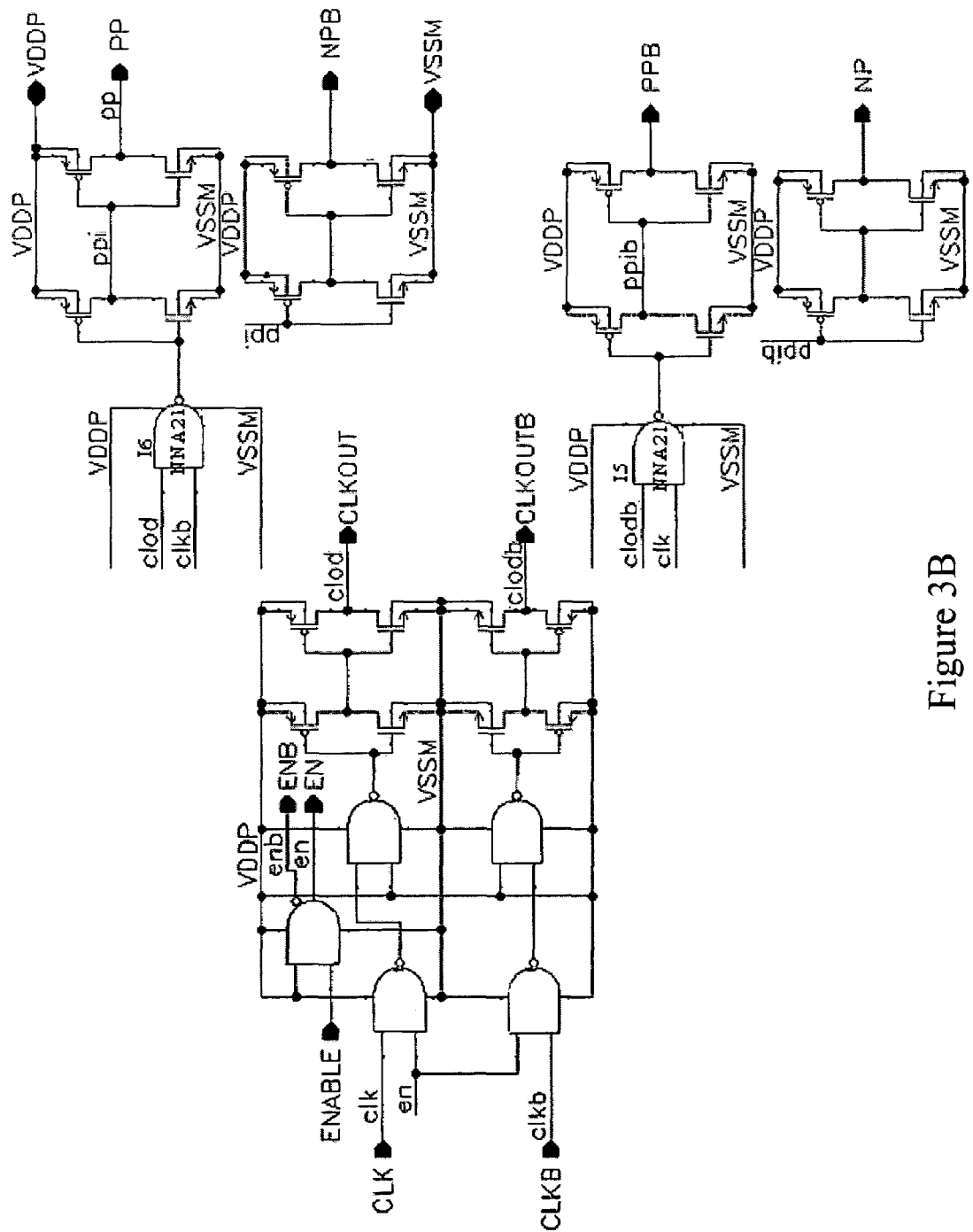
FIG. 3B is a circuit schematic illustrating a control section of an LV-PECL buffer according to an embodiment of the present invention.

In an implementation of the LV-PECL buffer of the present invention the circuit is divided into a drive section as shown in FIG. 3A and a control section as shown in FIG. 3B.

Refer to FIG. 3A, which is a circuit schematic illustrating a drive section of an LV-PECL buffer according to an embodiment of the present invention.

In the drive section of the LV-PECL buffer, the bias currents are obtained via cascade current mirrors from a band gap reference in order to accurately set and stabilize the PECL voltage levels VOH, VOL versus temperature and process variations. As a result, the LV-PECL buffer of the present invention is very stable regardless of any variations in temperature or processes.

N-MOSFET switches M30 and M12 are driven by CLKIN and CLKINB respectively. The key MOSFET's for the squaring of the waveform edges are M34 and M35 for the N-side and M36 and M37 for the P-side.

Refer to FIG. 3B, which is a circuit schematic illustrating a control section of an LV-PECL buffer according to an embodiment of the present invention.

In the control section of the LV-PECL buffer, the ENABLE signal and associated logic circuitry allow for an output high-impedance state (hi-Z). Nand gates I5 and I6 (NNA21) are used together with relative dimensioning of the staged buffers for the control lines NP (N-side Pulse), NPB (inverted NP), PP (P-side Pulse) and PPB (inverted PP).

It should be noted that in the circuits illustrated in FIG. 3A and FIG. 3B, voltage level standards have been applied, for example, VOLmin equals 1.49 volts, VOLmax equals 1.68 volts, VOHmin equals 2.275 volts, and VOHmax equals 2.42 volts. However, other voltage levels can be utilized as desired, appropriate, or as standards require.

Figure 4A:
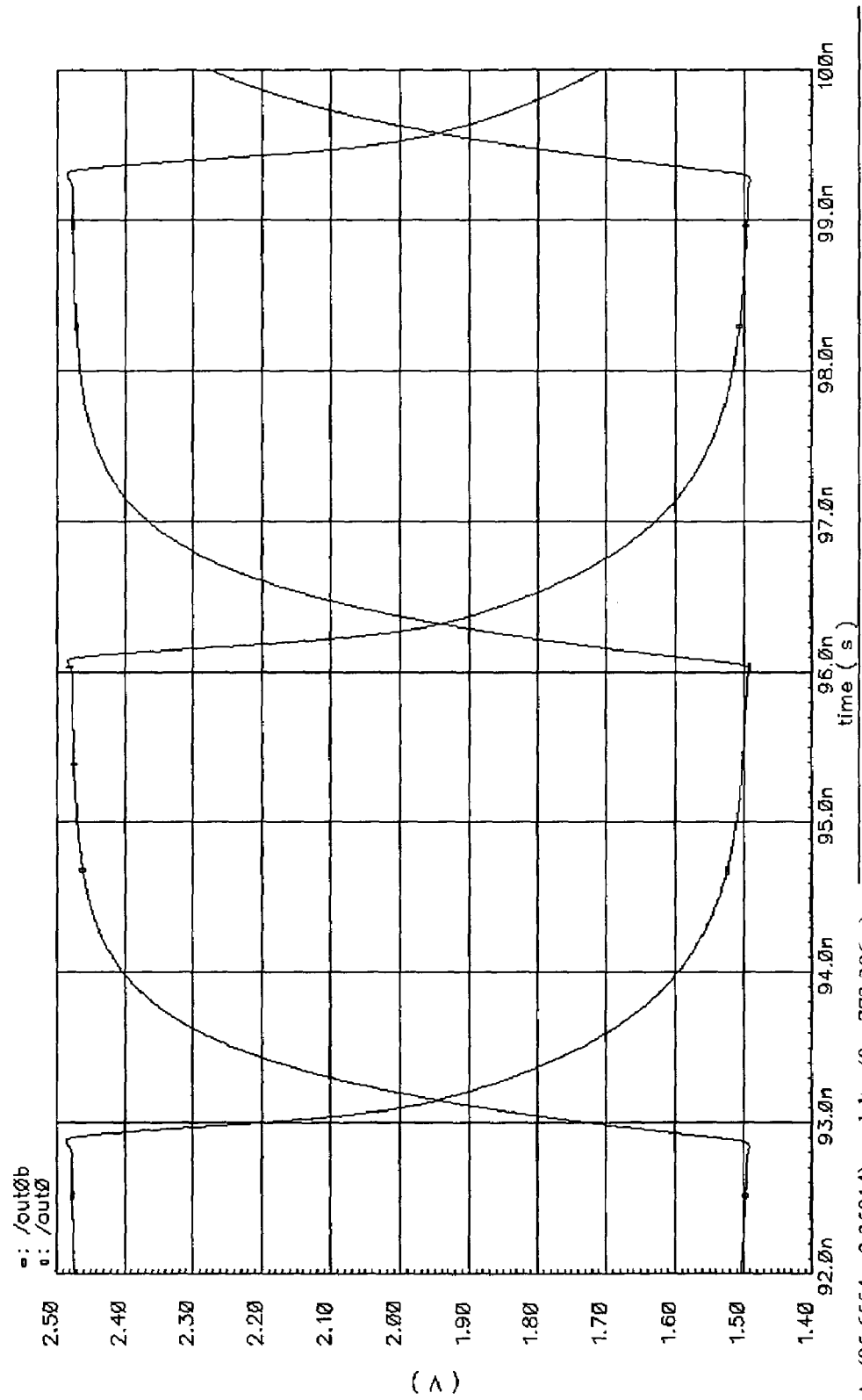
FIG. 4A is a diagram illustrating the transient response of the conventional buffer at 155 MHz.
Figure 4B:
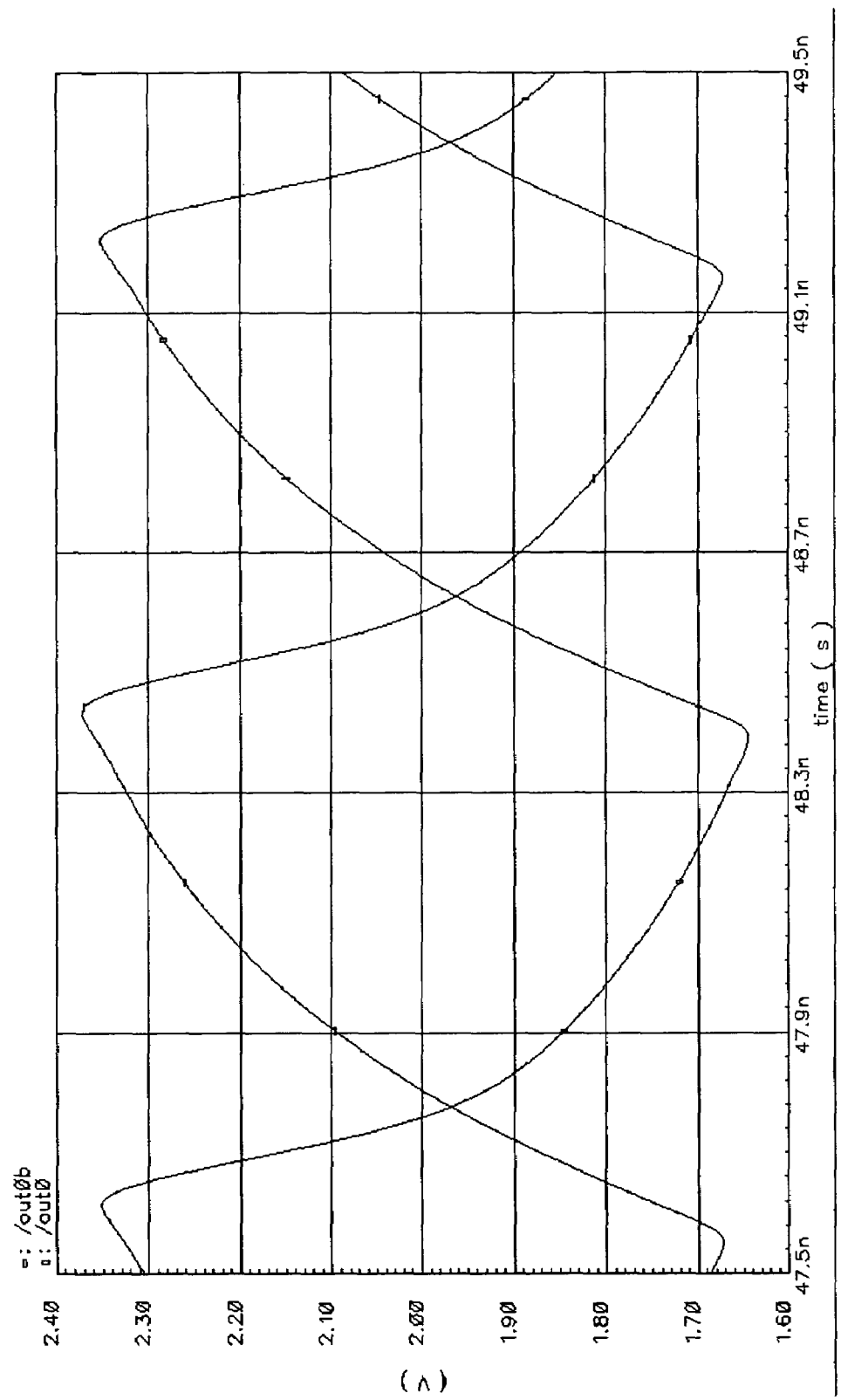
FIG. 4B is a diagram illustrating the transient response of the conventional buffer at 622 MHz.

Refer to FIG. 4A, which is a diagram illustrating the transient response of the conventional buffer at 155 MHz and to FIG. 4B, which is a diagram illustrating the transient response of the conventional buffer at 622 MHz.

As shown in FIG. 4A, the waveform is marginally acceptable at 155 MHz. However, it becomes readily apparent in FIG. 4B that the waveform degenerates into nearly a ramp or triangle signal. Obviously, the conventional buffer is incapable of operating at higher frequencies and is therefore useless at these higher frequencies.

Figure 5A:
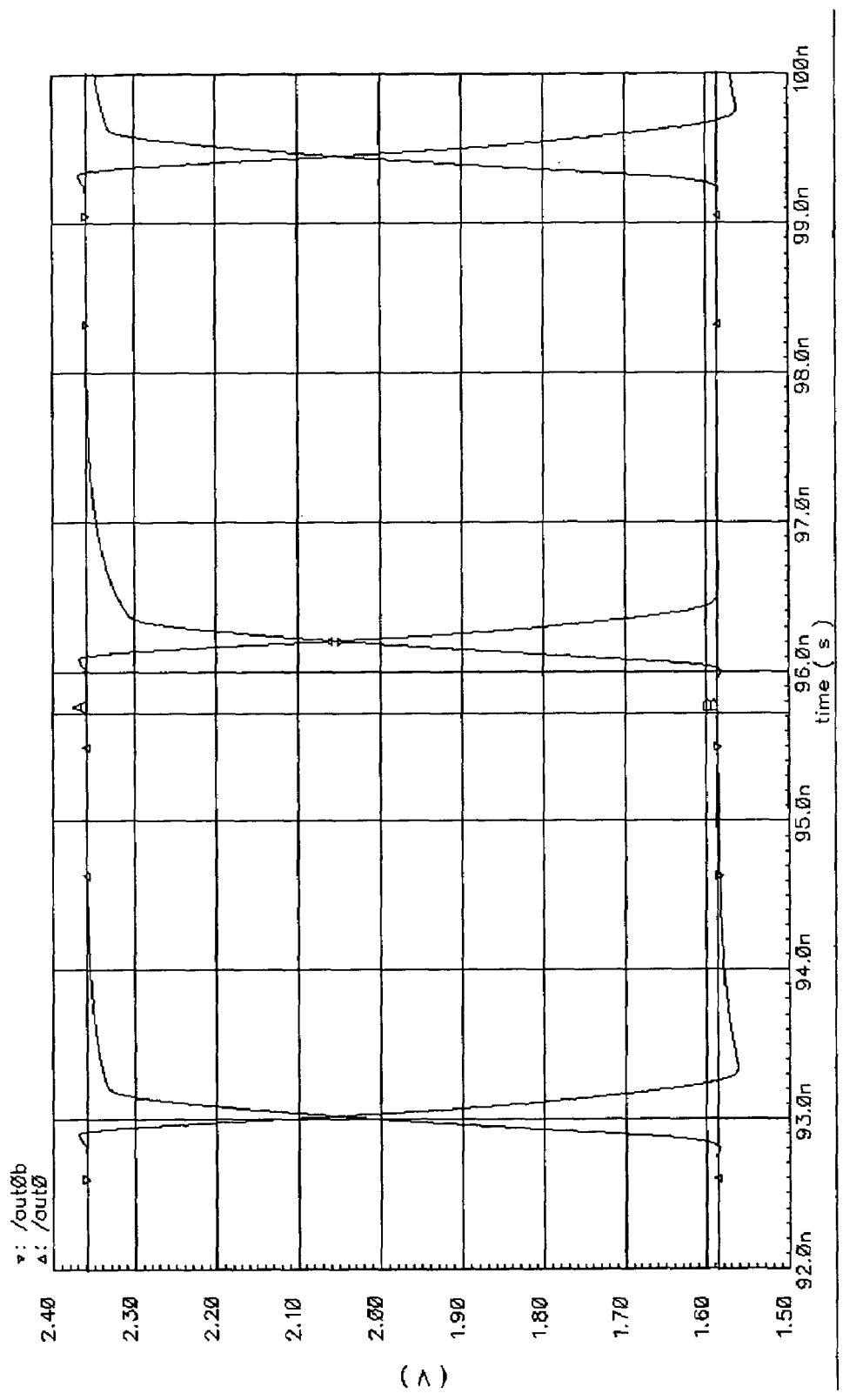
FIG. 5A is a diagram illustrating the transient response of the LV-PECL buffer of the present invention at 155 MHz.
Figure 5B:
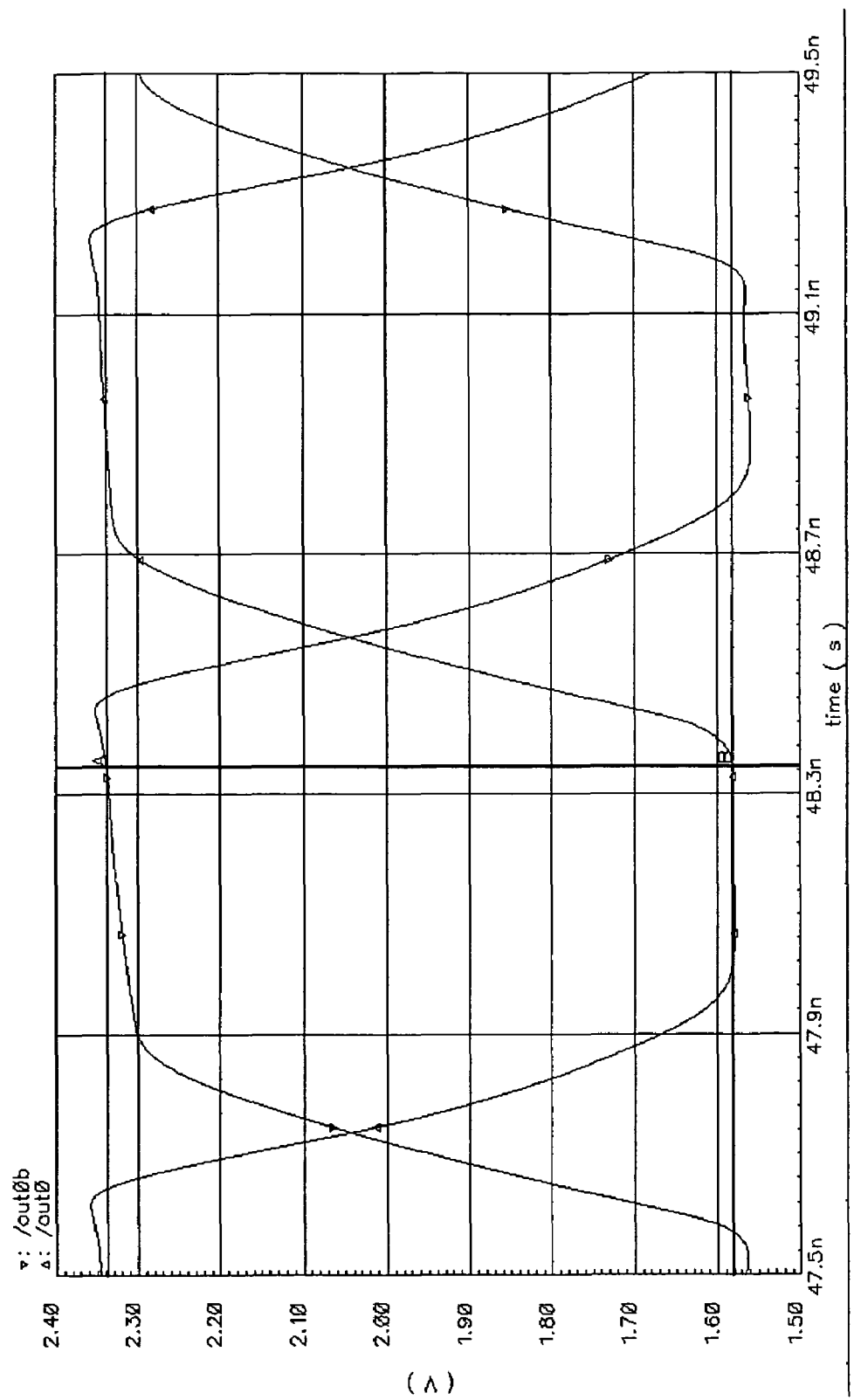
FIG. 5B is a diagram illustrating the transient response of the LV-PECL buffer of the present invention at 622 MHz.

Refer to FIG. 5A, which is a diagram illustrating the transient response of the LV-PECL buffer of the present invention at 155 MHz and to FIG. 5B, which is a diagram illustrating the transient response of the LV-PECL buffer of the present invention at 622 MHz.

As shown in FIG. 5A, the waveform is a clear square wave as desired at 155 MHz. Even at a high frequency of 622 MHz the waveform is still a nicely formed square wave as shown in FIG. 5B.

Obviously, the LV-PECL buffer in CMOS of the present invention provides a far superior circuit. As a result, devices utilizing the present invention provide buffers that are capable of operating at a high frequency.

Figure 6A:
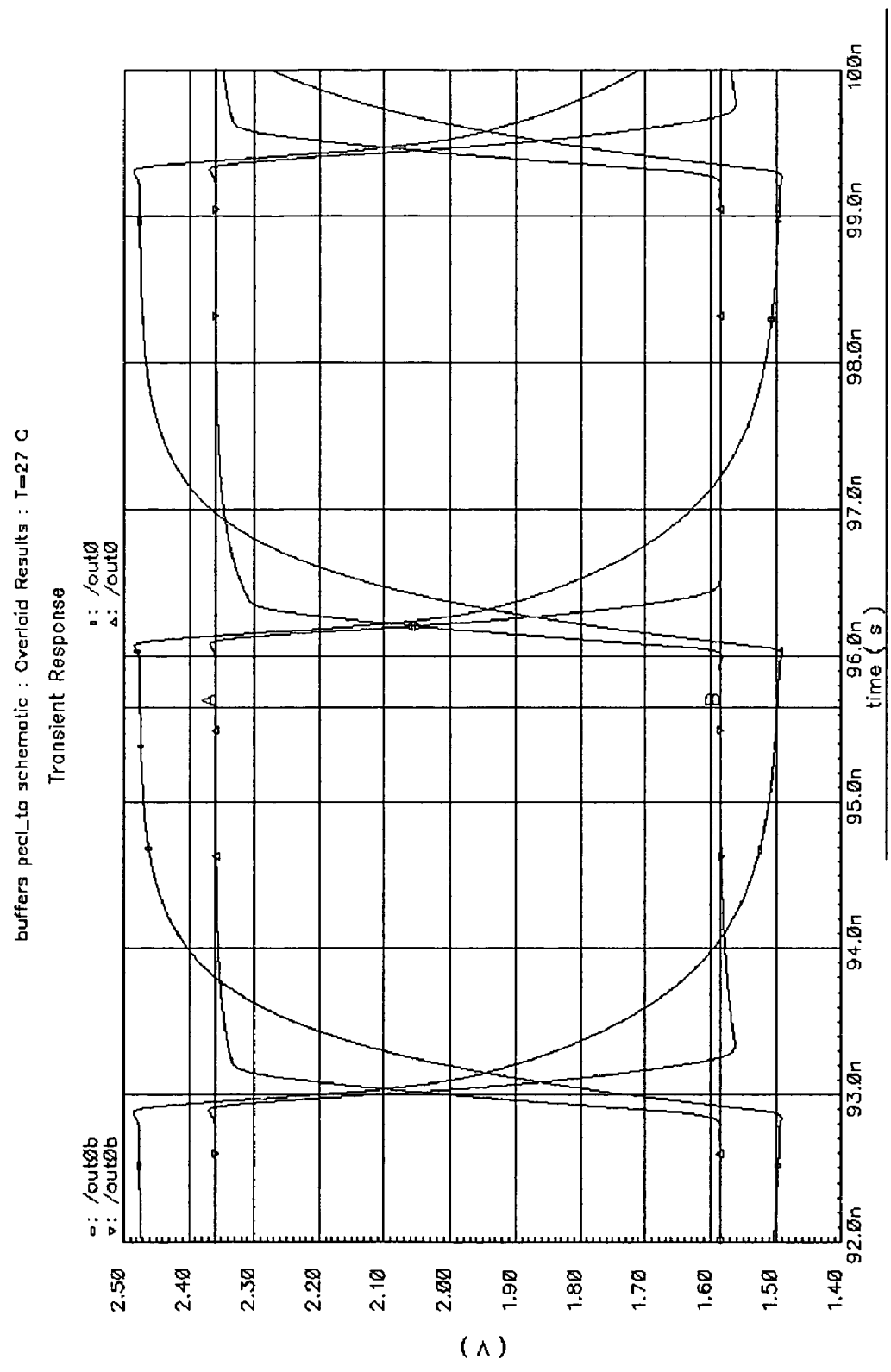
FIG. 6A is a diagram illustrating the overlaid transient responses of the conventional buffer and the LV-PECL buffer of the present invention at 155 MHz.
Figure 6B:
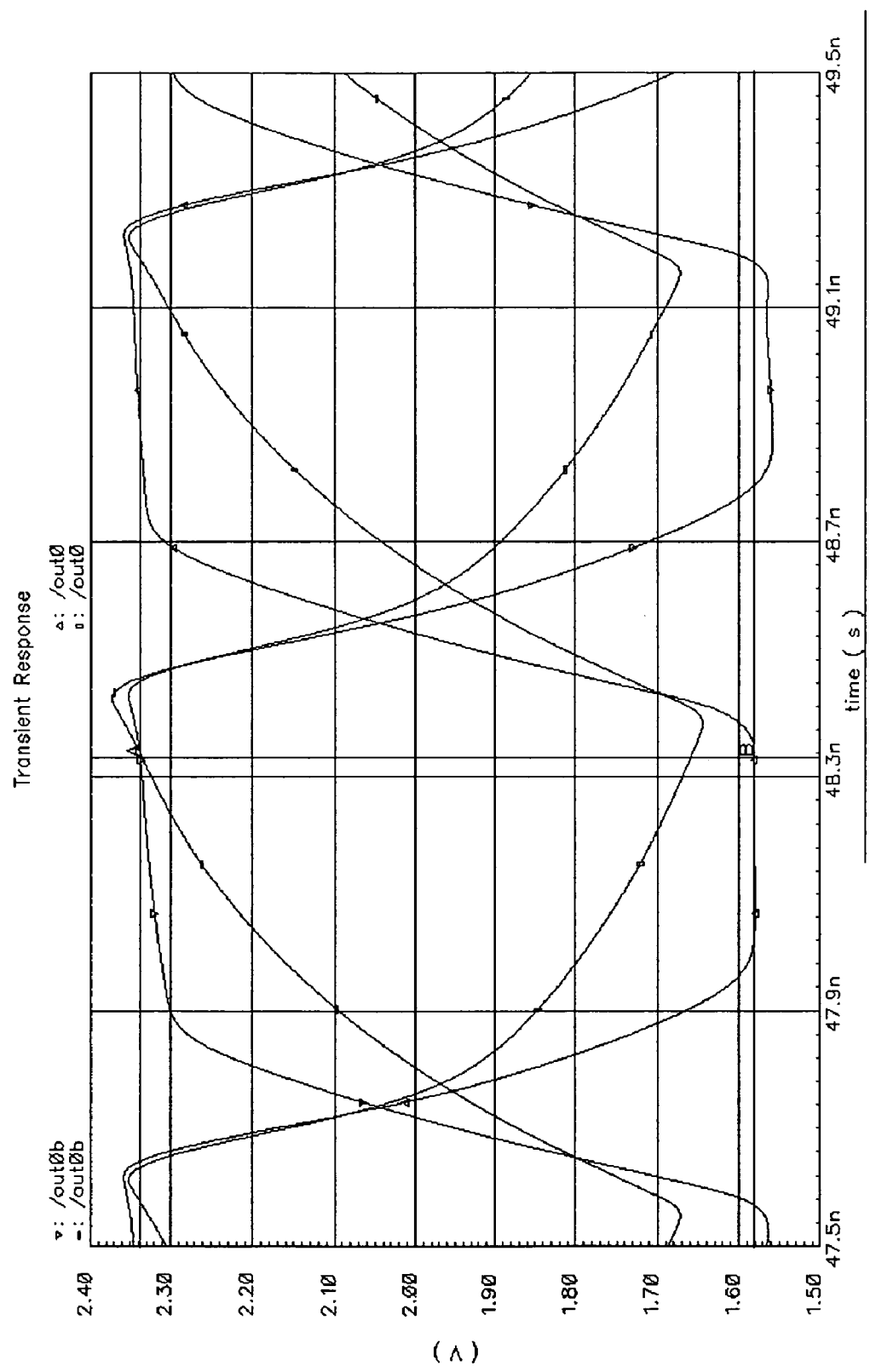
FIG. 6B is a diagram illustrating the overlaid transient responses of the conventional buffer and the LV-PECL buffer of the present invention at 622 MHz.

For reference, refer to FIG. 6A, which is a diagram illustrating the overlaid transient responses of the conventional buffer and the LV-PECL buffer of the present invention at 155 MHz and to FIG. 6B, which is a diagram illustrating the overlaid transient responses of the conventional buffer and the LV-PECL buffer of the present invention at 622 MHz.

Upon review of the overlaid responses, the shortcomings and inadequacies of the conventional buffer become easily apparent. As shown in the figures, the transient responses of the LV-PECL buffer of the present invention remain usable square waves irregardless of the frequency.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A low voltage positive emitter coupled logic buffer comprising:
   a clock input;
   a first voltage;
   a second voltage
   a switch comprising a first node, a second node, and a non-switching node;
   a first output connected to the first node of the switch;
   a second output connected to the second node of the switch;
   at least one first current source connected between the first voltage and the first output;
   at least one second current source connected between the first voltage and the second output; and
   a third current source connected between the non-switching node of the switch and the second voltage;
   wherein the clock input controls a switching frequency of the switch and wherein the switched current sources deliver a pull-up current of more than two values.

2. The low voltage positive emitter coupled logic buffer of claim 1, wherein the switch is an NMOS switch.

3. The low voltage positive emitter coupled logic buffer of claim 1, wherein the second voltage comprises a lower voltage than the first voltage.

4. The low voltage positive emitter coupled logic buffer of claim 1, wherein the buffer is fabricated in a CMOS process.

5. The low voltage positive emitter coupled logic buffer of claim 1, wherein the first output and second output are essentially inverse waveforms.

6. The low voltage positive emitter coupled logic buffer of claim 1, wherein no feedback loop is required and synchronized feedforward logic is utilized.

7. The low voltage positive emitter coupled logic buffer of claim 1, wherein the switched current sources deliver a pull-up current variable in time.

8. The low voltage positive emitter coupled logic buffer of claim 1, wherein the pull-up current is increased during output waveform transitions.

9. A low voltage positive emitter coupled logic buffer comprising:
- a clock input;
- a first voltage;
- a second voltage
- an NMOS switch comprising a first node, a second node, and a non-switching node;
- a first output connected to the first node of the NMOS switch;
- a second output connected to the second node of the NMOS switch;
- a first current source connected between the first voltage and the first output;
- a second current source connected between the first voltage and the first output;
- a third current source connected between the first voltage and the second output;
- a fourth current source connected between the first voltage and the second output; and
- a five current source connected between the non-switching node of the NMOS switch and the second voltage;
- wherein the clock input controls a switching frequency of the NMOS switch and wherein the switched current sources deliver a pull-up current variable in time and of more than two values.

10. The low voltage positive emitter coupled logic buffer of claim 9, wherein the second voltage comprises a lower voltage than the first voltage.

11. The low voltage positive emitter coupled logic buffer of claim 9, wherein the first output and second output are essentially inverse waveforms.

12. The low voltage positive emitter coupled logic buffer of claim 9, wherein no feedback loop is required and synchronized feedforward logic is utilized.

13. The low voltage positive emitter coupled logic buffer of claim 9, wherein the pull-up current is increased during output waveform transitions.

14. A low voltage positive emitter coupled logic buffer comprising:
- a drive circuit comprising:
  - a first N-MOSFET switch;
  - a second N-MOSFET switch;
  - a first clock;
  - a second clock;
  - wherein the first clock drives the first N-MOSFET switch and the second clock drives the second N-MOSFET switch;
  - bias current circuitry wherein bias currents are obtained via cascade current mirrors from a band gap reference in order to accurately set and stabilize voltage levels versus temperature and process variations;
  - a first output;
  - a second output; and
  - MOSFET circuitry for squaring waveform edges of the first output and second output; and
- a control circuit comprising;
  - logic circuitry;
  - an enable signal for the logic circuitry;
  - wherein the enable signal and the logic circuitry allow for an output high-impedance state; and
  - a plurality of control lines for controlling the first output and second output.

15. The low voltage positive emitter coupled logic buffer of claim 14, wherein the first output and second output are essentially inverse waveforms.

16. The low voltage positive emitter coupled logic buffer of claim 14, wherein no feedback loop is required and synchronized feedforward logic is utilized.

17. The low voltage positive emitter coupled logic buffer of claim 14, wherein switched current sources deliver a pull-up current variable in time and of more than two values.

18. The low voltage positive emitter coupled logic buffer of claim 17, wherein the pull-up current is increased during output waveform transitions.

* * * * *